United States Patent
Saito et al.

(10) Patent No.: US 8,456,010 B2
(45) Date of Patent: Jun. 4, 2013

(54) SEMICONDUCTOR DEVICE

(75) Inventors: Shinji Saito, Kanagawa (JP); Maki Sugai, Tokyo (JP); Eiji Muramoto, Kanagawa (JP); Shinya Nunoue, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 209 days.

(21) Appl. No.: 13/035,069

(22) Filed: Feb. 25, 2011

(65) Prior Publication Data

US 2012/0056153 A1 Mar. 8, 2012

(30) Foreign Application Priority Data

Sep. 6, 2010 (JP) ................................. 2010-198632

(51) Int. Cl.
*H01L 23/482* (2006.01)

(52) U.S. Cl.
USPC ...... 257/766; 257/86; 257/615; 257/E33.012; 257/E23.017; 438/657

(58) Field of Classification Search
USPC ............ 257/86, 615, 766, E33.012, E23.017; 438/657
See application file for complete search history.

(56) References Cited

U.S. PATENT DOCUMENTS

| | | | | |
|---|---|---|---|---|
| 5,889,295 | A * | 3/1999 | Rennie et al. | 257/96 |
| 6,008,539 | A * | 12/1999 | Shibata et al. | 257/745 |
| 6,287,947 | B1 | 9/2001 | Ludowise et al. | |
| 7,166,959 | B2 * | 1/2007 | Suzuki et al. | 313/504 |
| 7,722,966 | B1 * | 5/2010 | Lee et al. | 428/702 |
| 2009/0065795 | A1 | 3/2009 | Chan et al. | |
| 2009/0321714 | A1 | 12/2009 | Muramoto et al. | |
| 2011/0049506 | A1 * | 3/2011 | Rao et al. | 257/43 |
| 2011/0309385 | A1 * | 12/2011 | Nendai | 257/88 |
| 2012/0138894 | A1 * | 6/2012 | Qian et al. | 257/13 |

FOREIGN PATENT DOCUMENTS

| | | |
|---|---|---|
| JP | 2001-7398 | 1/2001 |
| JP | 2006-324296 | 11/2006 |
| JP | 2010-10591 | 1/2010 |

OTHER PUBLICATIONS

U.S. Appl. No. 12/878,967, filed Sep. 9, 2010, Sugawara et al.

* cited by examiner

*Primary Examiner* — Allan R Wilson
(74) *Attorney, Agent, or Firm* — Oblon, Spivak, McClelland, Maier & Neustadt, L.L.P.

(57) ABSTRACT

A semiconductor device of an embodiment includes: a semiconductor layer made of p-type nitride semiconductor; an oxide layer formed on the semiconductor layer, the oxide layer being made of a polycrystalline nickel oxide, and the oxide layer having a thickness of 3 nm or less; and a metal layer formed on the oxide layer.

15 Claims, 6 Drawing Sheets

SEMICONDUCTOR DEVICE

CROSS-REFERENCE TO RELATED APPLICATION

This application is based upon and claims the benefit of priority from Japanese Patent Applications No. 2010-198632, filed on Sep. 6, 2010; the entire contents of which are incorporated herein by reference.

FIELD

Embodiments described herein relate generally to a semiconductor device.

BACKGROUND

A nitride semiconductor is a wide-gap semiconductor having a wide band gap and is used as a substrate of a laser diode (LD), a semiconductor light emitting diode (LED), or the like by using the wide band gap. The nitride semiconductor has firm crystal and withstands large current and high voltage. Consequently, application to a heterojunction bipolar transistor of high output and the like is also considered.

Challenges of a semiconductor device using such a nitride semiconductor as a substrate are decrease in operation voltage and improvement in reliability. To solve the challenges, realization of a contact electrode structure having low resistance to a nitride semiconductor and high reliability is required.

DETAILED DESCRIPTION

A semiconductor device of an embodiment includes: a semiconductor layer made of p-type nitride semiconductor; an oxide layer formed on the semiconductor layer, the oxide layer being made of a polycrystalline nickel oxide, and the oxide layer having a thickness of 3 nm or less; and a metal layer formed on the oxide layer.

Embodiments of the invention will be described below with reference to the drawings.

(First Embodiment)

A semiconductor device of the embodiment includes: a p-type nitride semiconductor layer (a semiconductor layer); a polycrystalline nickel oxide layer (an oxide layer) formed on the p-type nitride semiconductor layer and having a thickness of 3 nm or less; and a metal layer formed on the nickel oxide layer.

Figure 1A:
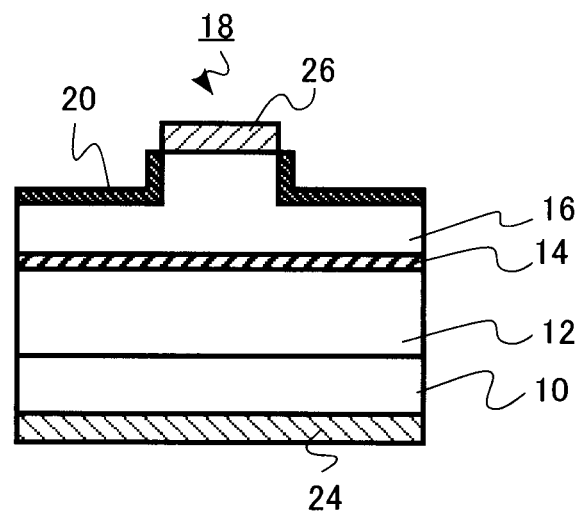
FIGS. 1A and 1B are schematic cross sections of a semiconductor device of a first embodiment.
Figure 1B:
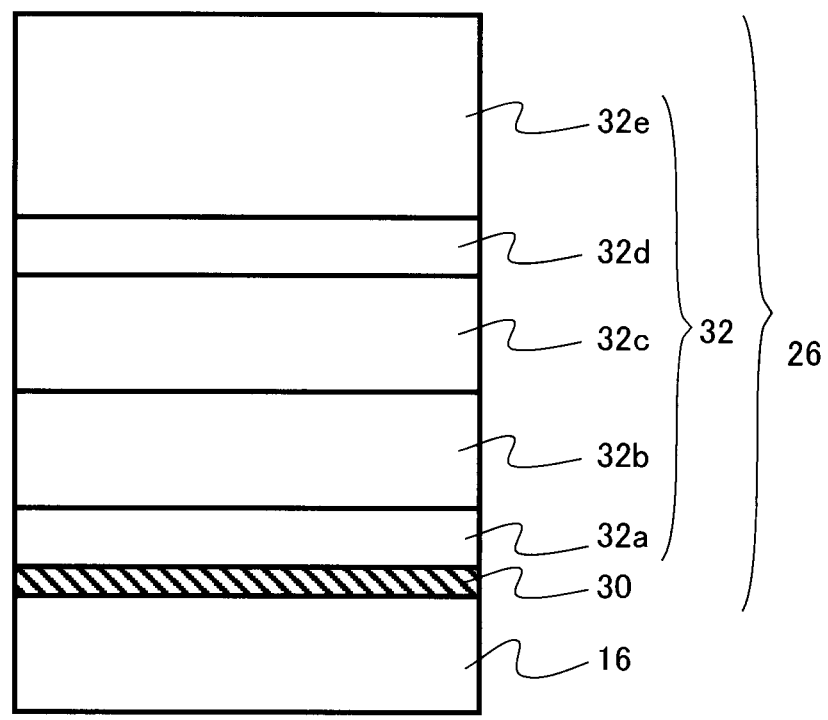

FIGS. 1A and 1B are cross sections of the semiconductor device of the first embodiment. The semiconductor device is a laser diode (LD) formed of a GaN (nitride gallium)-based semiconductor. FIG. 1A is a schematic cross section of the entire device, and FIG. 1B is an enlarged cross section of a contact structure of a p-side electrode.

In the laser diode as the semiconductor device of the embodiment, on the top face (one face) of a substrate 10 made of an n-type GaN (gallium nitride) semiconductor, as a GaN-based n-type nitride semiconductor layer 12, for example, an n-type cladding layer of Si-doped n-type $Al_{0.05}Ga_{0.95}N$ and an n-type guide layer of Si-doped n-type GaN are formed.

On the n-type nitride semiconductor layer 12, an active layer 14 having a multiple structure of a GaN-based semiconductor having a multiple quantum well structure (MQW), for example, $In_{0.12}Ga_{0.88}N/In_{0.03}Ga_{0.97}N$ is formed. The active layer 14 is a light emitting layer which emits light.

On the active layer 14, as a GaN-based p-type nitride semiconductor layer 16, for example, a p-type guide layer of Mg-doped p-type GaN, a p-type cladding layer of Mg-doped p-type $Al_{0.05}Ga_{0.95}N$, and a p-type contact layer of p-type GaN doped with about $1\times10^{20}$ $cm^{-3}$ of Mg are formed.

The p-type nitride semiconductor layer 16 is provided with a ridge stripe 18 for forming a laser beam waveguide region. Side faces of the ridge stripe 18 and the surface of a p-type cladding layer 16b are covered with, for example, an insulating film 20 of a silicon oxide film.

An n-side electrode 24 is provided on the under face (the other face) of the substrate 10, and a p-side electrode 26 is provided on the surface of the ridge stripe 18 of the p-type nitride semiconductor layer 16.

The details of the p-side electrode 26 forming the p-side contact structure will be described below with reference to FIG. 1A.

The p-side electrode 26 on p-type GaN in the uppermost part of the p-type nitride semiconductor layer 16 is formed by an NiO (nickel oxide) film 30 as a nickel oxide layer formed on p-type GaN and a metal layer 32 formed on the NiO film 30.

The NiO film 30 is made of polycrystal having a thickness of 3 nm or less and in the form of a layer. Desirably, the thickness of the NiO film 30 is 0.5 nm or larger from the viewpoint of stably forming a polycrystal film having uniform film thickness.

The metal layer 32 has a layer-stack structure of an Ni (nickel) film 32a which is in contact with the nickel oxide layer, an Au (gold) film 32b, a Ti (titanium) film 32c, a Pt (platinum) film 32d, and an Au (gold) film 32e. The Ni (nickel) film 32a has the function of improving adhesion between the NiO film 30 and the Au (gold) film 32b.

In the laser diode of the embodiment, between the p-type GaN as the p-type nitride semiconductor layer 16 and the metal layer 32, a contact structure provided with the NiO film 30 which is very thin, in the form of a layer, and is polycrystal is formed. By the contact structure, contact resistance between the p-type nitride semiconductor layer 16 and the metal layer 32 is reduced, and rising voltage is reduced. Therefore, the operating voltage of the laser diode can be reduced. Thus, power-light conversion efficiency of the laser diode improves.

Since the NiO film 30 is not amorphous but is crystal, the reliability of the laser diode improves. A factor of improvement in reliability is considered that since the film is crystal, an oxygen defect in the film is little, and film property change caused by movement of the oxygen defects in the film during use of the device is suppressed. Another factor of improvement in reliability is as follows. Since the film is crystal, even in the case where high-density current is passed, the barrier property to diffusion of a metal improves, and diffusion of the metal to the p-type nitride semiconductor layer is suppressed.

Figure 2A:
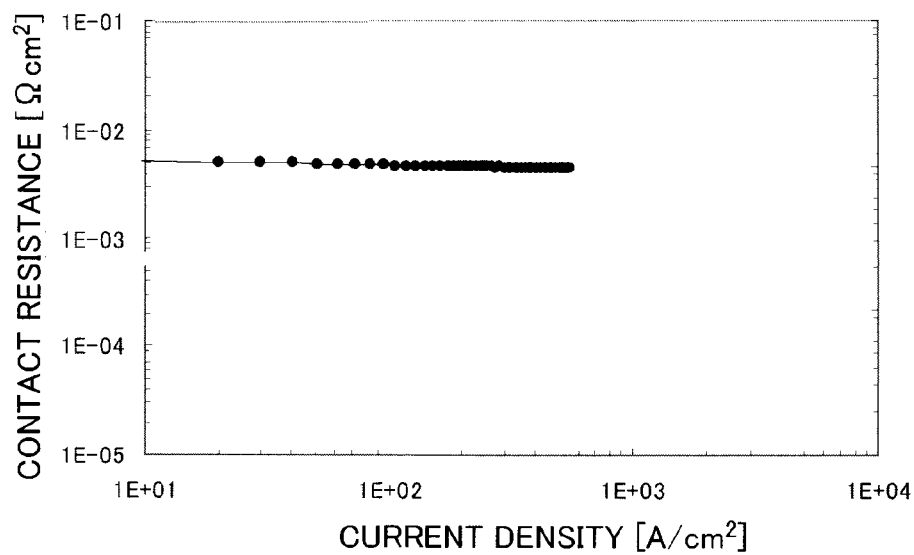
FIGS. 2A and 2B are diagrams showing contact resistance evaluation results.
Figure 2B:
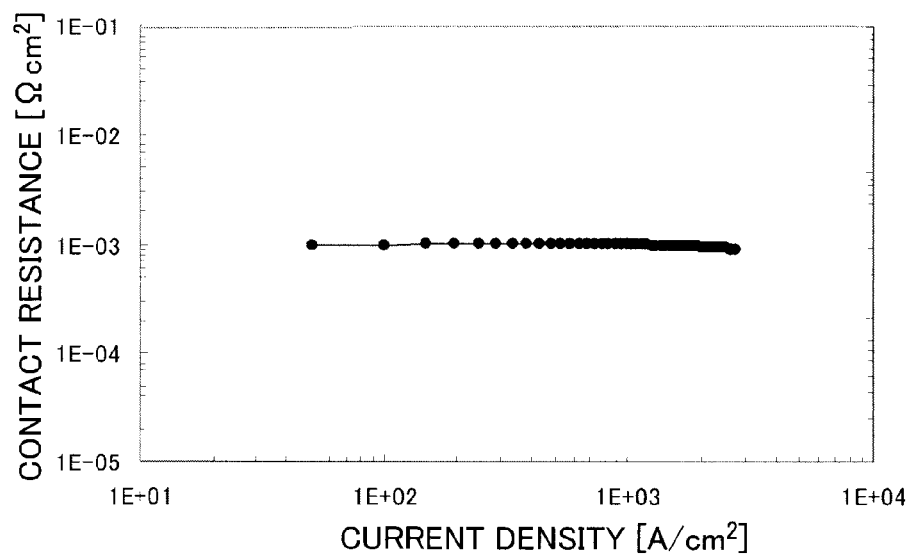

FIGS. 2A and 2B are diagrams showing contact resistance evaluation results. FIG. 2A shows the case where there is no NiO film between the p-type nitride semiconductor layer and the metal layer, and FIG. 2B shows the case where there is the NiO film between the p-type nitride semiconductor layer and the metal layer like in the embodiment. Evaluations are made on assumption that the thickness of the NiO film is 1 nm. For the evaluations, the TLM (Transmission Line Model) method using a substrate of p-type GaN is employed.

As obvious from FIG. 2, by making the NiO film interpose, the contact resistance is reduced to almost the half.

Figure 3A:
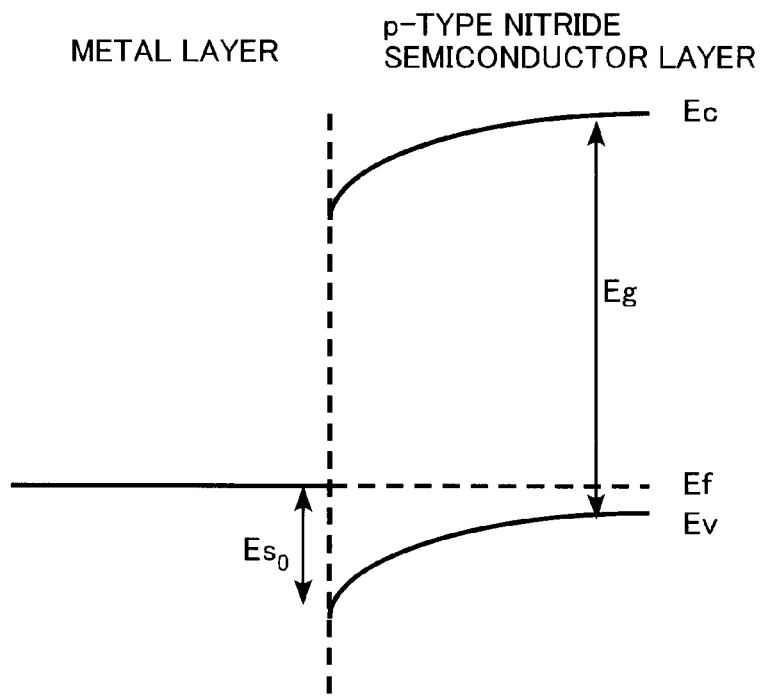
FIGS. 3A and 3B are diagrams for explaining a contact resistance reduction effect in the semiconductor device of the first embodiment.
Figure 3B:
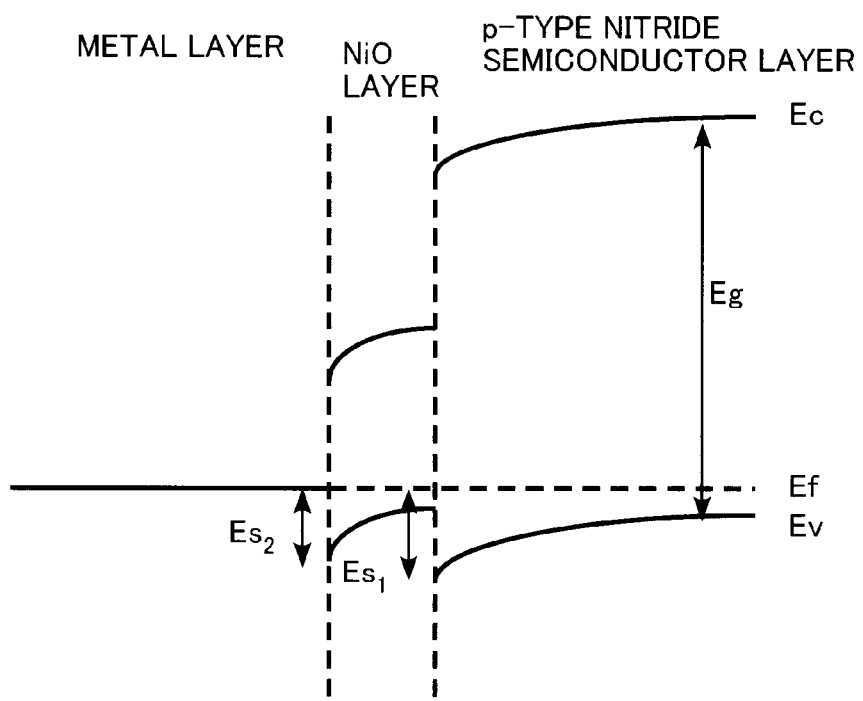

FIGS. 3A and 3B are diagrams for explaining a contact resistance reduction effect in the semiconductor device of the first embodiment. FIG. 3A is a band diagram showing the case where there is no NiO film between the p-type nitride semiconductor layer and the metal layer, and FIG. 3B is a band diagram showing the case where there is the NiO film between the p-type nitride semiconductor layer and the metal layer like in the embodiment.

As shown in FIG. 3B, by interposition of the NiO film having a bandgap smaller than that of the p-type nitride semiconductor layer between the p-type nitride semiconductor layer and the metal layer, the barrier between the p-type nitride semiconductor layer and the metal layer comes to have two stages $Es_1$ and $Es_2$. Both of $Es_1$ and $Es_2$ are smaller than a barrier $Es_0$ in the case where there is no NiO film. It is considered that the contact resistance is reduced by the decrease in the barrier.

Figure 4:
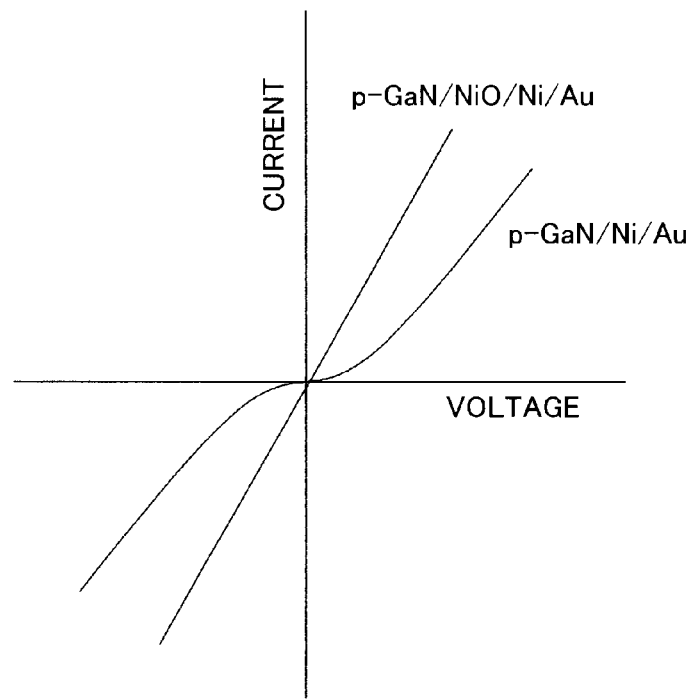
FIG. 4 is a diagram showing a voltage-current characteristic of a contact structure of the semiconductor device of the first embodiment.

FIG. 4 is a diagram showing a voltage-current characteristic of a contact structure of the semiconductor device of the first embodiment. It is understood that by providing the NiO film between p-type GaN and the metal layer, the ohmic characteristic improves. The reason why the non-ohmic characteristic becomes conspicuous when there is no NiO film is considered that the barrier between p-type GaN and the metal layer is high, and the barrier layer does not become low to the degree that carrier injection occurs due to heat release until the electric field becomes large to a certain degree. On the contrary, in the case where the NiO film is provided, the barrier between p-type GaN and the metal layer becomes low as described in the above model. Consequently, it is considered that carrier injection occurs due to heat release even at low voltage.

Figure 5:
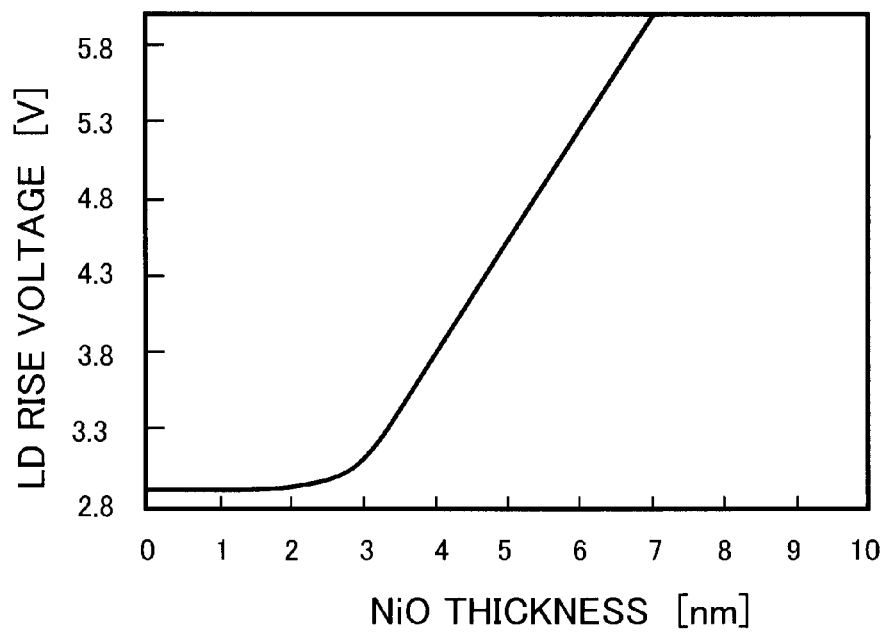
FIG. 5 is a diagram showing the relation between NiO film thickness and rise voltage of an LD in the first embodiment.

When the thickness of the crystal NiO film formed in a layer shape exceeds 3 nm, the contact resistance rises, and the rise voltage of the laser diode increases. FIG. 5 is a diagram showing the relation between NiO film thickness and rise voltage of the LD. The rise voltage of the laser diode shown in FIG. 1 is obtained by simulation.

Since the light emission wavelength of the laser diode of the embodiment is around 400 nm, ideally, 3 V corresponding to the energy of the bandgap is the rise voltage. As shown in FIG. 5, when the thickness of the NiO film is up to 3 nm, the rise voltage is almost 3 V. However, when the thickness exceeds 3 nm, the rise voltage rises.

It is generally considered that electric conduction in NiO is carried out by an oxygen defect caused by the amorphous state or insufficient oxidation. Consequently, in the case of the amorphous state or insufficient oxidation, even when the film thickness increases, resistance which is enough for practical use is obtained.

In the embodiment, the film is crystal and an oxygen defect is small, so that the resistance of the NiO film itself becomes high. In the simulation, perfect crystal is assumed, and conduction due to an oxygen defect is not considered. Consequently, the resistance component of the NiO film itself becomes large.

In the region of 3 nm or less, the film becomes thin, and tunnel injection of carries becomes possible. As a result, the rise voltage sharply drops. In addition, as described above, the barrier between p-type GaN and the metal layer becomes lower, so that almost ideal rise voltage of the LD is obtained.

In the embodiment, desirably, crystal grain size of the nickel oxide layer is larger than thickness of the nickel oxide layer. In the structure, the grain boundary does not exist or hardly exists in the thickness direction of the nickel oxide layer. Therefore, the reliability of the nickel oxide layer improves, and the reliability of the laser diode also improves.

The crystal grain size of the nickel oxide layer is obtained by, for example, measuring a plurality of greatest sizes of crystal grains observed in a TEM photograph or the like and averaging them.

Next, a method of manufacturing the semiconductor device of the embodiment will be described.

The substrate 10 of n-type GaN (gallium nitride) semiconductor in the wafer shape is subjected, for example, to pre-treatment using an organic solvent and acid. After that, by known MOCVD, while switching material gases, the n-type nitride semiconductor layer 12, the active layer 14 of the multiple structure, and the p-type nitride semiconductor layer 16 are formed.

Next, the ridge stripe 18 is formed by known dry etching. The insulating film 20 as a silicon oxide film is formed. After that, the insulating film 20 on the ridge stripe 18 is removed.

Next, by electrode deposition in a vacuum apparatus, an Ni film having a thickness of 3 nm or less is deposited on the p-type nitride semiconductor layer 16. After that, heat treatment of 450° C. or less is performed at normal pressure in oxygen-nitrogen mixed atmosphere to oxidize the Ni film and to form the NiO film 30 of polycrystal as a nickel oxide layer.

Desirably, the oxygen-nitrogen mixed atmosphere is atmosphere having oxygen of 20% or less. From the viewpoint of increasing the grain size of the crystal, more desirably, the heat treatment temperature is 400° C. or less.

Next, by electrode deposition in a vacuum apparatus, on the NiO film 30, the Ni (nickel) film 32a, the Au (gold) film 32b, the Ti (titanium) film 32c, the Pt (platinum) film 32d, and the Au (gold) film 32e are deposited to form the p-side electrode 26. After that, for example, heat treatment may be performed for annealing in the nitrogen atmosphere.

Subsequently, the side opposite to the p-side electrode 26 of the substrate 10 is thinned by polishing. A Ti (titanium) film, a Pt (platinum) film, and an Au (gold) film are deposited to form the n-side electrode 24.

The wafer is cut by cleavage to form a resonator mirror. After that, the wafer is separated into chips. One side of the resonator mirror is formed by, for example, a high-reflection film as a dielectric multilayer film, and a light emission face is formed by a low-reflection film. After that, the chip is mounted on a heat sink.

By the above manufacturing method, the semiconductor device of the embodiment is manufactured.

In the manufacturing method, by performing the heat treatment of 450° C. or less on the Ni film in the oxygen-nitrogen mixed atmosphere, sufficient oxidation is realized stably, and the very-thin polycrystal NiO film having a layer shape and large crystal grain size can be manufactured.

(Second Embodiment)

A second embodiment is different from the first embodiment with respect to the point that the semiconductor device is not the laser diode (LD) but is a light emitting diode (LED).

The second embodiment is different from the first embodiment with respect to the point that the metal layer on the NiO film has a layer-stack structure of an Ag (silver) film, a Ti (titanium) film, a Pt (platinum) film, and an Au (gold) film. The action and effect produced by providing the NiO film are similar to those of the first embodiment. Therefore, the contents overlapping with the first embodiment will not be repeated.

Figure 6A:
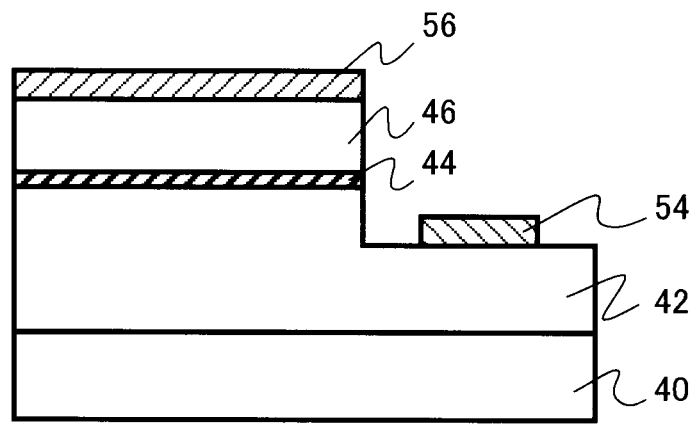
FIGS. 6A and 6B are schematic cross sections of a semiconductor device of a second embodiment.
Figure 6B:
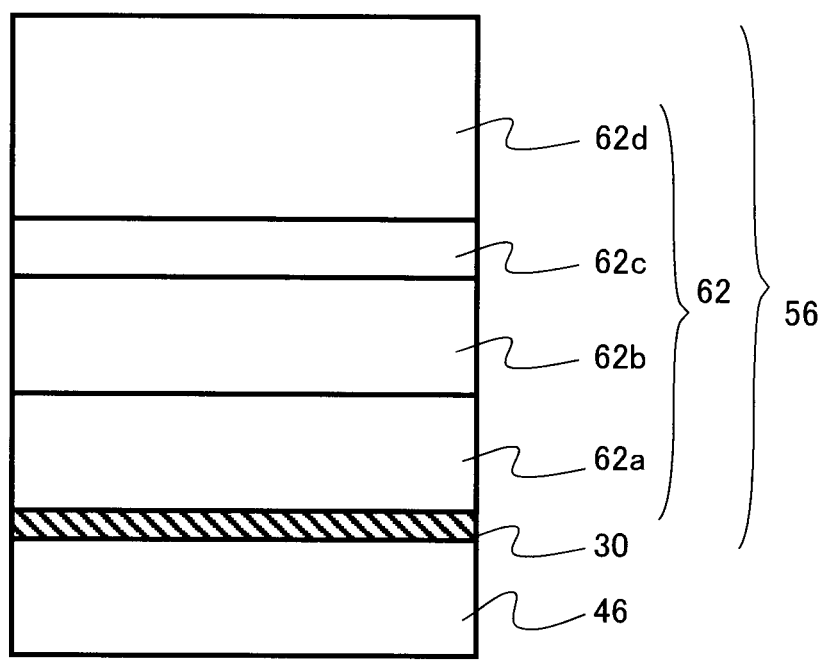

FIGS. 6A and 6B are schematic cross sections of the semiconductor device of the second embodiment. The semiconductor device is a light emitting diode (LED) formed of a GaN (nitride gallium)-based semiconductor. FIG. 6A is a schematic cross section of the entire device, and FIG. 6B is an enlarged cross section of a contact structure of a p-side electrode.

In the light emitting diode as the semiconductor device of the embodiment, for example, on a light transmissive substrate 40 of sapphire, a guide layer made of Si-doped n-type GaN is formed as a GaN-based n-type nitride semiconductor layer 42. Between the light transmissive substrate 40 and the n-type nitride semiconductor layer 42, for example, a buffer layer of AlN may be provided. The light transmissive substrate 40 is a substrate which transmits light emitted by the active layer, for example, visible light.

On the n-type nitride semiconductor layer 42, an active layer (light emitting layer) 44 which emits light is formed. The active layer 44, for example, has the MQW (multiple quantum) formed of InGaN-based nitride semiconductor. The layer stack structure of a barrier layer, a quantum well layer, and a barrier layer is repeated, for example, a plurality of times.

On the active layer 44, as a GaN-based p-type nitride semiconductor layer 46, for example, a p-type guide layer of Mg-doped P-type GaN, and a p-type contact layer of p-type GaN doped with about $1 \times 10^{20}$ cm$^{-3}$ of Mg are formed.

An n-side electrode 54 is provided in a region in which the active layer 44 is not formed, in the n-type nitride semiconductor layer 42. The n-side electrode 54 has, for example, a layer stack structure of a Ti film, a Pt film, and an Au film.

Further, a p-side electrode 56 is provided on the p-type nitride semiconductor layer 46. The p-side electrode 56 functions also as a reflection electrode which reflects light emitted from the active layer 44 to the light transmissive substrate 40 side. The details of the p-side electrode 56 forming the p-side contact structure will be described below with reference to FIG. 6B.

The p-side electrode 56 on p-type GaN in the uppermost part of the p-type nitride semiconductor layer 46 is formed by the NiO (nickel oxide) film 30 as a nickel oxide layer formed on p-type GaN and a metal layer 62 formed on the NiO film 30.

The NiO film 30 is made of polycrystal having a thickness of 3 nm or less and in the form of a layer. Desirably, the thickness of the NiO film 30 is 0.5 nm or larger from the viewpoint of forming a polycrystal film having uniform film thickness.

The metal layer 62 has a layer-stack structure of an Ag (silver) film 62a which is in contact with the nickel oxide layer, a Ti (titanium) film 62b, a Pt (platinum) film 62c, and an Au (gold) film 62d.

In the light emitting diode of the embodiment, between the p-type GaN as the p-type nitride semiconductor layer 46 and the metal layer 62, a contact structure provided with the NiO film 30 which is very thin, in the form of a layer, and is polycrystal is formed. By the contact structure, contact resistance between the p-type nitride semiconductor layer 46 and the metal layer 62 is reduced, and the operating voltage can be therefore reduced. Thus, power-light conversion efficiency of the light emitting diode improves.

Since the NiO film 30 is not amorphous but is crystal, the reliability of the light emitting diode improves. A factor of improvement in reliability is considered that since the film is crystal, an oxygen defect in the film is little, and film property change caused by movement of the oxygen defects in the film during use of the device is suppressed. Another factor of improvement in reliability is considered as follows. Since the film is crystal, even in the case where high-density current is passed, the barrier property to diffusion of a metal improves, and diffusion of the metal to the p-type nitride semiconductor layer is suppressed.

By providing the NiO film 30 which is very thin, formed in the form of a layer, and is polycrystal between the p-type GaN as the p-type nitride semiconductor layer 46 and the metal layer 62 serving as a reflection electrode, the reflectance of the reflection electrode improves.

Next, a method of manufacturing the semiconductor device of the embodiment will be described.

On the light transmissive substrate 40 of sapphire having a wafer shape, for example, using AlN as a buffer layer, an n-type GaN as the n-type nitride semiconductor layer 42, the active layer 44 of an InGaN-based nitride semiconductor, and p-type GaN as the p-type nitride semiconductor layer 46 are formed by epitaxial growth by the known MOCVD.

Next, for example, the wafer is processed with aqua regia and an Ni film having a thickness of 3 nm or less is deposited on the p-type nitride semiconductor layer 46 by electrode deposition in a vacuum apparatus. Further, by electrode deposition in a vacuum apparatus, on the Ni film, the Ag (silver) film 62a, the Ti (titanium) film 62b, the Pt (platinum) film 62c, and the Au (gold) film 62d are deposited to form the p-side electrode 56.

After that, for example, heat treatment of 450° C. or less is performed at normal pressure in oxygen-nitrogen mixed atmosphere to oxidize the Ni film and to form the NiO film 30 of polycrystal as a nickel oxide layer. When the temperature exceeds 450° C., it is unpreferable since there is the possibility that the NiO film is formed in an island shape, not a layer shape.

Desirably, the oxygen-nitrogen mixed atmosphere is atmosphere having oxygen of 20% or less. From the viewpcint of increasing the grain size of the crystal, more desirably, the heat treatment temperature is 400° C. or less.

Next, patterning is performed with a resist, and the n-type nitride semiconductor layer 42 in the region where the n-side electrode 54 is formed is exposed by dry etching. Next, patterning is performed so that the region except for the region where the n-side electrode 54 is to be formed is covered with the resist.

Next, by electrode deposition in a vacuum apparatus, a Ti (titanium) film, a Pt (platinum) film, and an Au (gold) film are deposited on n-type GaN, and the n-side electrode 54 is formed by the lift-off method. To protect a region in which an electrode is not formed, a protection film of an insulating film may be properly formed in the manufacturing process.

After that, the wafer is diced into chips. The chip is mounted on a heat sink.

By the above manufacturing method, the semiconductor device of the embodiment is manufactured.

In the manufacturing method, by performing the heat treatment of 450° C. or lesson the Ni film in the oxygen-nitrogen mixed atmosphere, sufficient oxidation is realized, and the very-thin polycrystal NiO film having a layer shape and large crystal grain size can be manufactured.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, with respect to the structure of the metal layer, the structure other than the layer stack structures described in the embodiments can be applied. For example, an Al film can be also applied in place of an Au film or an Ag film on the NiO film.

Any layer configurations, film thicknesses, compositions, and the like of the nitride semiconductor layer and the active layer of the laser diode and the light emitting diode may be employed as long as they realize the functions of the semiconductor light emitting device. The present invention is not limited to the configurations of the embodiments.

Although the semiconductor light emitting devices such as the laser diode and the light emitting diode have been described as examples in the embodiments, for example, the invention can be also applied to the contact structure in any of the other semiconductor devices such as a high-output heterojunction bipolar transistor using nitride semiconductor for a substrate.

Although the GaN-based semiconductor has been described as an example of the nitride semiconductor, the invention can be also applied to the other nitride semiconductors such as AlN-based and InN-based nitride semiconductors.

EXAMPLES

Examples will be described below.

Example 1

A semiconductor laser diode similar to that described in the first embodiment was formed.

On a wafer-shaped n-type GaN (gallium nitride) semiconductor substrate, as a GaN-based n-type nitride semiconductor layer, an n-type cladding layer of Si-doped n-type $Al_{0.05}Ga_{0.95}N$ and an n-type guide layer of Si-doped n-type GaN were formed.

On the n-type nitride semiconductor layer, an active layer having a multiple structure of $In_{0.12}Ga_{0.88}N/In_{0.03}Ga_{0.97}N$, of a GaN-based semiconductor having a multiple quantum well structure (MQW) is formed.

On the active layer, as a GaN-based p-type nitride semiconductor layer, an undoped GaN guide layer, a p-type overflow preventing layer of Mg-doped p-type $Al_{0.2}Ga_{0.8}N$, a p-type cladding layer of Mg-doped p-type $Al_{0.05}Ga_{0.95}N$, and a p-type contact layer of p-type GaN doped with about $1\times10^{20}$ $cm^{-3}$ of Mg were formed.

A ridge stripe was formed by known dry etching. An insulating film as a silicon oxide film was formed. After that, the insulating film on the ridge stripe was removed by acid treatment.

Next, by electrode deposition in a vacuum apparatus, an Ni film having a thickness of 1 nm was deposited on p-type GaN as a p-type contact layer. After that, heat treatment of 395° C. was performed for one minute at normal pressure in oxygen-nitrogen mixed atmosphere containing 20% of oxygen to oxidize the Ni film and to form a NiO film.

Next, by electrode deposition in a vacuum apparatus, on the NiO film, an Ni film having a thickness of 2 nm, an Au film having a thickness of 100 nm, a Ti film having a thickness of 100 nm, a Pt film having a thickness of 50 nm, and an Au film having a thickness of 500 nm were deposited to form a p-side electrode.

Subsequently, the side opposite to the p-side electrode 26 of the substrate 10 was polished so that the wafer is thinned to a thickness of 150 μm. A Ti film having a thickness of 100 nm, a Pt film having a thickness of 50 nm, and an Au film having a thickness of 500 nm were deposited to form an n-side electrode.

The wafer was cut by cleavage to form a resonator mirror. After that, the wafer was separated into chips. One side of the resonator mirror was formed by a high-reflection film as a dielectric multilayer film, and a light emission face was formed by a low-reflection film. After that, the chip was mounted on a heat sink.

The operating voltage of the device was 4.8 V in 2W operation. The rise voltage was 3.0 V.

In observation of the p-side electrode part with a transmission electron microscope (TEM), the NiO film was formed in a layer shape having a thickness of 1 nm almost uniformly and was polycrystal. The crystal grain size of the NiO film was larger than the thickness of the NiO film and, a so-called bamboo structure was formed.

When the ratio between the number of atoms of Ni (nickel) of the NiO film and the number of atoms of O (oxygen) was checked by photoelectron spectrometry (XPS) immediately after oxidation in the heat treatment, it was Ni:O=1:0.99. Also in an analysis in a time-of-flight secondary ion mass spectrometry apparatus (TOF-SIMS), Ni:O=1:0.98. In such a manner, it was confirmed that a NiO crystal having a composition extremely close to a stoichiometric composition is formed.

The reliability of the device was evaluated. An acceleration test of temperature of 80° C. was conducted to monitor deterioration in the luminous efficiency. By a test of 10,000 hours, deterioration of 10% was observed.

Comparative Example 1

A laser diode was manufactured by a manufacturing method similar to that of Example 1 except that the thickness of the Ni film was set to 5 nm.

The rise voltage was 4.5 V. In a manner similar to Example 1, by observation with a transmission electron microscope (TEM), it was recognized that the NiO film was formed in a layer shape having a thickness of 5 nm almost uniformly and was polycrystal.

Figure 7:
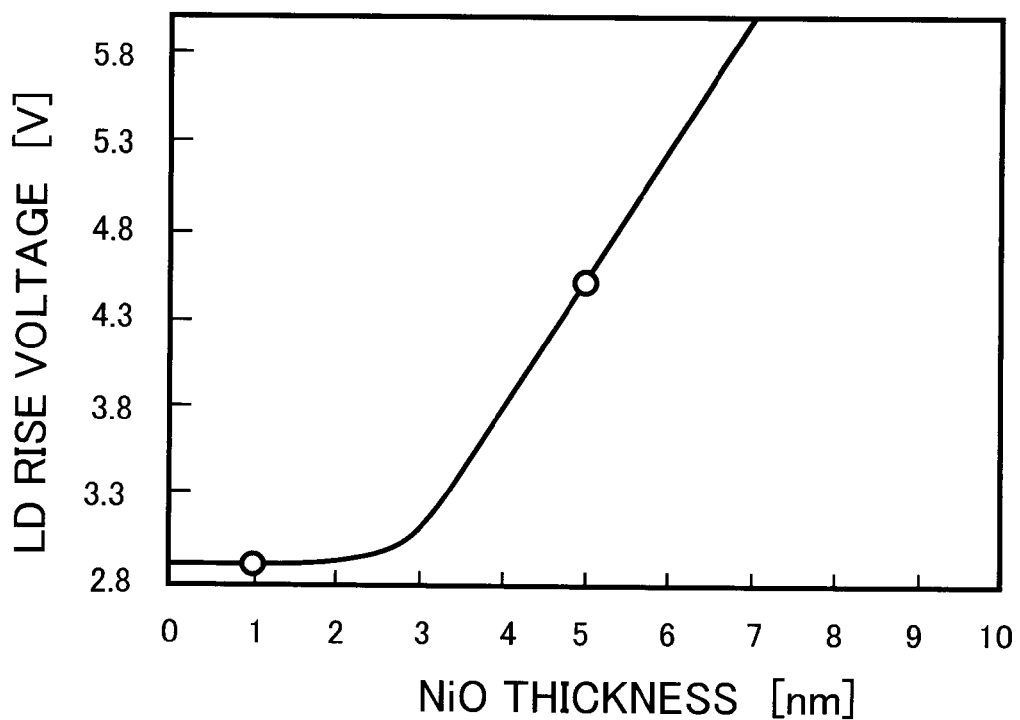
FIG. 7 is a diagram showing rise voltages of LDs of example 1 and comparative example 1.

FIG. 7 is a diagram showing rise voltages of LDs of example 1 and comparative example 1. A simulation result shown in FIG. 5 will be also described. Consistency between simulation and actual measurement on the relation between the NiO film thickness and the rise voltage was recognized.

Comparative Example 2

A laser diode was manufactured by a manufacturing method similar to that of Example 1 except that heat treatment after formation of an Ni film was not performed, and after deposition, on an NiO film, of an Au film having a thickness of 100 nm, a Ti film having a thickness of 100 nm, a Pt film having a thickness of 50 nm, and an Au film having a thickness of 500 nm, heat treatment of 550° C. for 10 minutes was performed at normal pressure in oxygen-nitrogen mixed atmosphere having 20% of oxygen to oxidize the Ni film.

By observation with a transmission electron microscope (TEM), it was understood that Au was moved, an Au film was formed on a p-type GaN layer, an NiO film was formed on the Au film, and a Ti film, a Pt film, and an Au film were formed on the NiO film. That is, the NiO film does not have a contact structure interposing between p-type GaN and the metal layer.

The reliability of the device was evaluated in a manner similar to Example 1. By a test of 1,000 hours, deterioration of 30% was observed.

Example 2

A semiconductor light emitting diode similar to that described in the second embodiment was formed.

On a light transmissive substrate of sapphire having a wafer shape, a buffer layer of AlN, n-type GaN as an n-type nitride semiconductor layer, an active layer of InGaN, a p-type AlGaN layer as a p-type nitride semiconductor layer, and p-type GaN were formed by epitaxial growth in MOCVD. In an uppermost part of p-type GaN, as a p-type contact layer, p-type GaN doped with about $1\times10^{20}$ cm$^{-3}$ of Mg was formed.

Next, the wafer was processed with aqua regia and an Ni film having a thickness of 2.8 nm was deposited on the p-type GaN as the p-type contact layer by electrode deposition in a vacuum apparatus. Further, by electrode deposition in a vacuum apparatus, on the Ni film, an Ag film, a Ti film, a Pt film, and Au film were deposited.

After that, heat treatment of 395° C. was performed for one minute at normal pressure in oxygen-nitrogen mixed atmosphere containing 20% of oxygen to oxidize the Ni film and to form a NiO film, thereby forming a p-side electrode.

Next, patterning is performed with a resist, and n-type GaN in the region where an n-side electrode is to be formed is exposed by dry etching. Next, patterning was performed so that the region except for the region where the n-side electrode is to be formed is covered with the resist.

Next, by electrode deposition in a vacuum apparatus, a Ti film, a Pt film, and an Au film were deposited on n-type GaN, and an n-side electrode was formed by the lift-off method. To protect a region in which an electrode is not formed, a protection film of an insulating film was properly formed in the manufacturing process.

The wafer was diced into chips in 300 μm in height and width. After that, the chip was mounted on a heat sink with an Ag paste.

The device expressed 2.8 V in voltage when current was 20 mA. Also in the case where current is set to 200 mA, the device operates stably, and the operation voltage was 3.1 V.

In observation of the p-side electrode part with a transmission electron microscope (TEM), the NiO film was formed in a layer shape having a thickness of 2.8 nm almost uniformly and was polycrystal. The crystal grain size of the NiO film was larger than the thickness of the NiO film and, a so-called bamboo structure was formed.

The reliability of the device was evaluated. An acceleration test with constant current of 1 A was conducted to monitor occurrence of leak current. No leak current occurred also in a test for 5,000 hours, so that excellent reliability was recognized.

Example 3

A semiconductor light emitting diode was formed by a manufacturing method similar to that described in the second embodiment except that an Al (aluminum) film was formed in place of the Ag film in the reflection electrode.

The reliability of the device was evaluated in a mariner similar to Example 2. No leak current occurred also in a test for 10,000 hours, and excellent reliability was recognized.

Comparative Example 3

A semiconductor light emitting diode was formed by a manufacturing method similar to that described in the second embodiment except that a NiO film is not formed between p-type GaN and the Ag film.

The reliability of the device was evaluated in a manner similar to Example 2. A leak current occurred in a test for 100 hours.

What is claimed is:

1. A semiconductor device comprising:
a p-type nitride semiconductor layer;
a metal layer; and
an oxide layer formed between the p-type nitride semiconductor layer and the metal layer, the oxide layer being made of a polycrystalline nickel oxide, and the oxide layer having a thickness of 3 nm or less.

2. The device according to claim 1, wherein crystal grain size of the oxide layer is larger than thickness of the oxide layer.

3. The device according to claim 1, wherein the metal layer includes a silver (Ag) film being in contact with the oxide layer.

4. The device according to claim 1, wherein the metal layer includes a nickel (Ni) film being in contact with the oxide layer, and a gold (Au) film formed on the nickel film.

5. The device according to claim 1, wherein the p-type nitride semiconductor layer is made of p-type gallium nitride (GaN).

6. A semiconductor device comprising:
an n-side electrode;
a p-side electrode;
an n-type nitride semiconductor layer formed between the n-side electrode and the p-side electrode;
a p-type nitride semiconductor layer formed between the n-type nitride semiconductor layer and the p-side electrode; and
an active layer formed between the n-type nitride semiconductor layer and the p-type nitride semiconductor layer, the active layer emitting light,
wherein the p-side electrode includes a polycrystalline nickel oxide layer having a thickness of 3 nm or less and a metal layer being in contact with the nickel oxide layer, the p-side electrode reflects light emitted from the active layer.

7. The device according to claim 6, wherein crystal grain size of the nickel oxide layer is larger than thickness of the nickel oxide layer.

8. The device according to claim 6, wherein the metal layer has a silver (Ag) film being in contact with the nickel oxide layer.

9. The device according to claim 6, wherein the metal layer has a layer-stack structure of a silver (Ag) film being in contact with the nickel oxide layer, a titanium (Ti) film, a platinum (Pt) film, and a gold (Au) film.

10. The device according to claim 6, wherein the p-type nitride semiconductor layer is made of p-type gallium nitride (GaN).

11. A semiconductor device comprising:
a semiconductor substrate;

an n-type nitride semiconductor layer formed on one face of the substrate;

an active layer formed on the n-type nitride semiconductor layer, the active layer emitting light;

a p-type nitride semiconductor layer formed on the active layer, the p-type nitride semiconductor having a ridge stripe;

an n-side electrode formed on the other face of the substrate; and a p-side electrode formed on the ridge stripe, the p-side electrode including a polycrystalline nickel oxide layer having a thickness of 3 nm or less and a metal layer formed on the nickel oxide layer.

12. The device according to claim 11, wherein crystal grain size of the nickel oxide layer is larger than thickness of the nickel oxide layer.

13. The device according to claim 11, wherein the metal layer has a nickel (Ni) film being in contact with the nickel oxide layer, and a gold (Au) film formed on the nickel film.

14. The device according to claim 11, wherein the metal layer has a layer-stack structure of an Ni (nickel) film being in contact with a nickel oxide layer, an Au (gold) film, a Ti (titanium) film, a Pt (platinum) film, and an Au (gold) film.

15. The device according to claim 11, wherein the p-type nitride semiconductor layer is made of p-type gallium nitride (GaN).

* * * * *